United States Patent
Moriya

(10) Patent No.: US 7,560,776 B2
(45) Date of Patent: Jul. 14, 2009

(54) SEMICONDUCTOR DEVICE, ELECTRONIC APPARATUS, METHOD OF MANUFACTURING SEMICONDUCTOR DEVICE, AND METHOD OF MANUFACTURING ELECTRONIC APPARATUS

(75) Inventor: Soichi Moriya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 499 days.

(21) Appl. No.: 11/389,078

(22) Filed: Mar. 27, 2006

(65) Prior Publication Data

US 2006/0220022 A1    Oct. 5, 2006

(30) Foreign Application Priority Data

Mar. 30, 2005  (JP)  ............... 2005-100066

(51) Int. Cl.
H01L 21/336  (2006.01)
(52) U.S. Cl. ............... 257/346; 257/347; 438/299
(58) Field of Classification Search .............. 257/347, 257/346; 438/299
See application file for complete search history.

(56) References Cited

U.S. PATENT DOCUMENTS 6,514,801 B1    2/2003  Yudasaka et al.

2006/0060855 A1    3/2006  Lee et al.

FOREIGN PATENT DOCUMENTS

| JP | A 2-206132 | 8/1990 |
| JP | A 2-224275 | 9/1990 |
| JP | A 2004-063975 | 2/2004 |
| JP | A-2005-340410 | 12/2005 |
| KR | 2006-0026244 | 3/2006 |
| WO | WO 00/59040 | 10/2000 |
| WO | WO 03/098696 A1 | 11/2003 |

Primary Examiner—Douglas M Menz
(74) Attorney, Agent, or Firm—Oliff & Berridge, PLC

(57) ABSTRACT

A semiconductor device includes first and second electrodes disposed apart from each other on a substrate, a gate electrode disposed so as to face the first and second electrodes and to cover at least part of each of the first and second electrodes, a semiconductor layer disposed between the first and second electrodes and the gate electrode, and a gate insulating layer disposed between the gate electrode and the semiconductor layer, the gate insulating layer having a film thickness that is greater in portions located directly above areas where the first and second electrodes are under the gate electrode than in a portion located directly above an area between the first and second electrodes.

14 Claims, 5 Drawing Sheets

SEMICONDUCTOR DEVICE, ELECTRONIC APPARATUS, METHOD OF MANUFACTURING SEMICONDUCTOR DEVICE, AND METHOD OF MANUFACTURING ELECTRONIC APPARATUS

BACKGROUND OF THE INVENTION

1. Technical Field

The present invention relates to a semiconductor device with a thin film transistor (hereinafter, referred to as a "TFT"), an electronic apparatus, a method of manufacturing a semiconductor device, and a method of manufacturing an electronic apparatus, and particularly to improvement of a TFT fabricated by using a liquid phase process.

2. Related Art

A TFT is made of thin films such as a conducting film, an insulating film, and a semiconductor film. A chemical vapor deposition (hereinafter, abbreviated as "CVD") method and a sputtering method are used for formation of such films. Formation of mask patterns using a resist material and etching are required for patterning thin films. Therefore, expensive manufacturing equipment is necessary for manufacturing a semiconductor device with a TFT It is also necessary to take environmental measures.

Manufacturing a TFT (organic TFT) using a liquid material has been investigated to meet these needs. For example, JP-A-2004-63975, which is an example of related art, discloses a method of forming a conducting film of an electrically conductive material, an insulating film of an epoxy resin, a polyimide resin, an acrylic resin, or the like, and a semiconductor film of an organic semiconductor material of pi-conjugated low molecular weight molecule (small molecule) or high molecular weight polymer by using liquid phase processes.

A liquid phase process, however, has a difficulty in forming a TFT having a very small area, resulting in the provision of a TFT having such a structure that an end of a gate electrode layer is over source and drain electrodes with a gate insulating layer interposed therebetween.

In formation of a gate electrode layer by a droplet discharge method (ink-jet method) or the like, if the minimum line width is, for example, 10 μm, the channel length is shortened until it reaches about several μm. As a result, a TFT has a large total area of the portions in which source and drain electrodes are under the gate electrode layer.

The large total area of the portions in a TFT causes an increase in parasitic capacitance between the gate electrode layer and the source and drain electrodes, thereby reducing the performance of the TFT as a switching element.

If an end of the gate electrode layer extends over the source and drain electrodes, an electric field concentration occurs at the end of the gate electrode layer. As a result, dielectric breakdown is likely to occur in portions of a gate insulating layer sandwiched by the end of the gate electrode layer and the source and drain electrodes.

SUMMARY

An advantage of the invention is to provide a semiconductor device having a TFT capable of avoiding occurrence of dielectric breakdown and an increase in parasitic capacitance at an end of a gate electrode layer of a TFT fabricated by using a liquid material, an electronic apparatus, a method of manufacturing a semiconductor device, and a method of manufacturing an electronic apparatus.

In order to achieve the above advantage, a semiconductor device according to an aspect of the invention includes first and second electrodes disposed apart from each other on a substrate, a gate electrode disposed so as to face the first and second electrodes and to cover at least part of each of the first and second electrodes, a semiconductor layer disposed between the first and second electrodes and the gate electrode, and a gate insulating layer disposed between the gate electrode and the semiconductor layer, the gate insulating layer having a film thickness that is greater in portions located directly above areas where the first and second electrodes are under the gate electrode than in a portion located directly above an area between the first and second electrodes.

Alternatively, a semiconductor device according to another aspect of the invention includes first and second electrodes formed on a substrate, a semiconductor layer formed to cover an area between the first and second electrodes on the first and second electrodes, a gate insulating layer formed on the semiconductor layer, and a gate electrode formed on the gate insulating layer, the gate electrode having portions that are directly above the first and second electrodes, and the gate insulating layer having a film thickness that is greater in portions located directly above areas where the first and second electrodes are under the gate electrode than in a portion located directly above an area between the first and second electrodes. In particular, a portion of the semiconductor layer formed between the first and second electrodes is a channel region.

In the semiconductor device as described above, the gate insulating layer has a large film thickness around its periphery. This enables avoidance of dielectric breakdown at the periphery (end) of the gate electrode layer. Also, the parasitic capacitance is reduced due to a large film thickness around the periphery of the gate insulating layer.

The gate insulating layer is preferably formed to have a film thickness that gradually increases from the portion located directly above an area between the first and second electrodes towards the portions located directly above areas where the first and second electrodes are under the gate electrode.

A method of manufacturing a semiconductor device according to still another aspect of the invention includes forming a first and second electrodes that are disposed apart from each other on a substrate, forming a semiconductor layer in an area between the first and second electrodes and on the first and second electrodes, forming a gate insulating layer so as to cover the semiconductor layer, and forming a gate electrode layer on the gate insulating layer, the gate insulating layer being formed to have a film thickness that is greater in portions located directly above areas where the first and second electrodes are under the gate electrode than in a portion located directly above an area between the first and second electrodes.

The method of manufacturing a semiconductor device as described above makes it possible to obtain a transistor structure in which the gate insulating layer has different film thicknesses between a portion corresponding to the channel region mentioned above and its outside portion.

The step of forming a gate insulating layer preferably includes providing a liquid material in which a gate insulating layer material is dissolved in a solvent on the semiconductor layer to form a coated film, and removing the solvent from the coated film. The step of removing the solvent from the coated film also preferably adjusts a drying rate at an end of the coated film to be faster than a drying rate in a portion other than the end. Thus, a gate insulating layer having a film thickness that is small at the center portion and large at the periphery can be obtained.

Prior to the step of forming the gate insulating layer, a treatment to reduce a contact angle with respect to the liquid material in an area to be provided with the liquid material is preferably performed. Alternatively, prior to the step of forming the gate insulating layer, a surface tension adjuster may be added to the liquid material to reduce a contact angle with respect to the liquid material in an area to be provided with the liquid material. Thus, a shape of the gate insulating layer after being coated with a liquid material can be controlled, speeding up drying at the center portion rather than the periphery of the coated film. The film thickness at the periphery of the gate insulating layer can thereby be made large.

Preferably, the liquid material is discharged from a droplet discharge device and is provided to the semiconductor layer. The use of a droplet discharge device (such as ink-jet device) allows accurate control of the location for a material liquid to be provided and the amount of the material liquid, thereby allowing accurate patterning of the gate insulating layer.

BRIEF DESCRIPTION OF THE DRAWINGS

The invention will be described with reference to the accompanying drawings, wherein like reference numbers refer to like elements.

FIG. 1A is a plan view and FIG. 1B is a sectional view taken along the line A-A' in FIG. 1A.

DESCRIPTION OF THE EMBODIMENTS

Embodiments of the invention will now be described with reference to the accompanying drawings.

Vapor phase processes and liquid phase processes are normally used as film-formation techniques. Examples of the vapor phase techniques include CVDs (including metal organic chemical vapor deposition (MOCVD), low pressure CVD, and electron cyclotron resonance-CVD (ECR-CVD)), deposition, molecular beam deposition (MB), sputtering, ion plating, etc. These techniques can be used independently or in combination of two or more types thereof.

In a liquid phase process, a liquid material is supplied to a base, a solvent is removed (a dispersion medium is removed), and thereafter a heat treatment is applied as the need arises, thereby forming a film (each layer). Examples of the technique of supplying a liquid material include: a spin coating method, a casting method, a microgravure coating method, a gravure coating method, a bar coating method, a roll coating method, a wire bar coating method, a dip coating method, a spray coating method, a screen printing method, a flexoprinting method, an offset printing method, a droplet discharge method (such as an ink-jet method), and a microcontact printing method. These techniques can be used independently or in combination of two or more types thereof.

Embodiment One

Figure 1A:
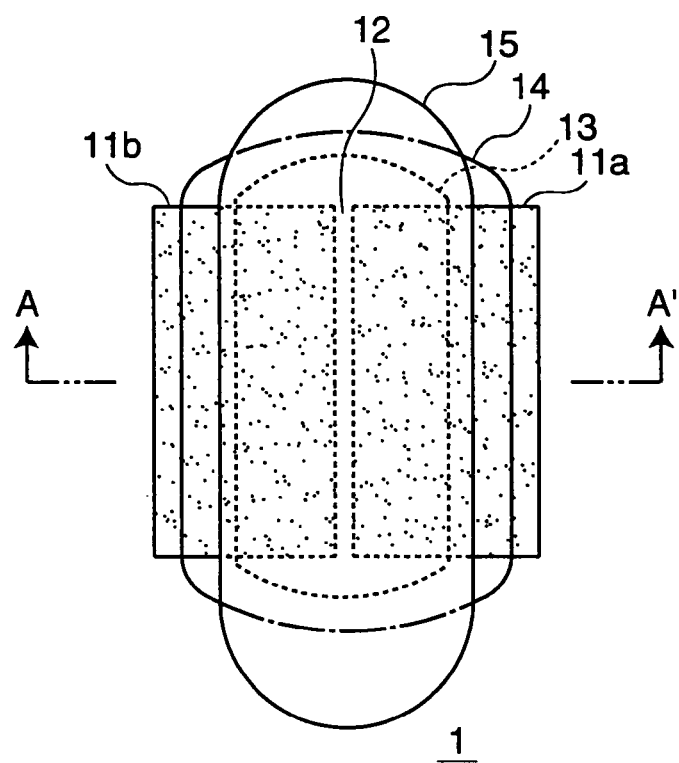
FIGS. 1A and 1B are explanatory diagrams for explaining a TFT in an embodiment one.
Figure 1B:
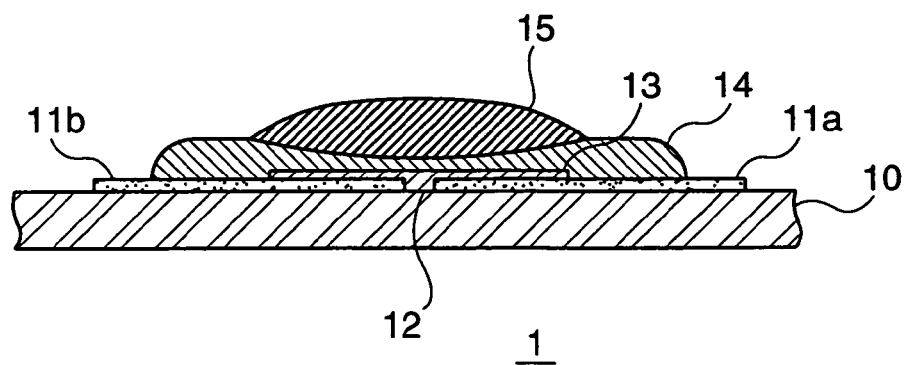

FIGS. 1A and 1B show an embodiment of a semiconductor device of the invention. FIG. 1A is a plan view of a TFT 1 fabricated by a liquid phase process, and FIG. 1B is a sectional view showing a section in the direction of line A-A' in FIG. 1A. The same reference numbers indicate corresponding elements throughout both views.

The embodiment attempts to improve the isolation voltage and to reduce the parasitic capacitance by forming a gate insulating layer to be thin on a channel region of a semiconductor film and to be thick on an area other than the channel region in the structure of a TFT in which a gate electrode layer overlaps source and drain electrodes as seen from the top of the TFT. The film thickness of the gate insulating layer gradually increases from the channel region towards the outside. This causes avoidance of a steep electric field in the gate insulating layer.

As shown in FIGS. 1A and 1B, the TFT 1 has such a structure that first and second electrodes hereinafter, referred to as "source and drain electrodes") 11 (a source electrode 11a and a drain electrode 11b), a channel section 12, a semiconductor layer 13, a gate insulating layer 14, a gate electrode layer 15, and the like are stacked on a resin substrate 10.

The resin substrate 10 is a flexible plastic insulating substrate. On the resin substrate 10, the source and drain electrodes consisting of the first electrode (hereinafter, referred to as the "source electrode") 11a and the second electrode (hereinafter, referred to as the "drain electrode") 11b are formed.

In the TFT 1, which of the two electrodes is a source electrode or a drain electrode is determined depending on the specific operating state of a circuit. The source electrode 11a and the drain electrode 11b in the embodiment are only determined for descriptive purposes. Accordingly, if it is unnecessary to especially differentiate the two electrodes, they are referred to as the "source and drain electrodes". The conducting films of the source and drain electrodes 11 are formed and functioned as electrodes and interconnections that are not shown, in addition to the electrodes of the TFT 1.

The source electrode 11a and the drain electrode 11b are formed to face each other with a gap, which is the channel section 12 of the TFT 1, interposed therebetween on the resin substrate 10.

The semiconductor layer 13 is formed evenly to cover part of the source electrode 11a, part of the drain electrode 11b, and the whole gap between the source electrode 11a and the drain electrode 11b. The semiconductor layer 13 is placed to make the gap (the center region of the channel) laid thereunder, and is an island-shaped layer having a film thickness of about 40 to 100 nm in its area partially covering the source and drain electrodes 11a and 11b.

The gate insulating layer 14 is formed to extend over the source electrode 11a, the semiconductor layer 13, and the drain electrode 11b, covering the whole semiconductor layer 13.

The gate insulating layer 14 is formed such that its film thickness is thin in a portion directly above the channel section 12 and gradually increases from the portion directly above the channel section 12 towards the outside as shown in FIG. 1B. Such a structure can be obtained in a manner to be described later. For example, a material for a gate insulating layer is applied by a droplet discharge method, and dried and baked, and a gate insulating layer material is repeatedly applied onto the baked layer, and dried and baked, thereby enabling the structure described above to be obtained. In the structure of the gate insulating layer 14 obtained in such a manner, as will be described later, electric charges are easy to be induced in the channel section 12 of the semiconductor layer 13 and difficult to be induced in a portion located apart from the channel section 12 of the semiconductor layer 13 by the gate electrode layer 15.

The gate electrode layer 15 is formed of a conductive material on the gate insulating layer 14. The gate electrode layer 15 is formed, for example, by applying a gate insulating layer material to the gate insulating layer 14 so that metal particulates dispersed in a dispersion medium, for example, are concentrated in the center portion having the smallest film thickness and baking the applied material. In addition, the conductive polymer material, poly-ethylendioxythiophene (PEDOT), to be mentioned later may be used as the material.

Therefore, as shown in FIG. 1B, the section of the gate electrode layer 15 is convex shaped such that its center portion corresponds to the thinnest portion of the gate insulating layer 14 and its both ends correspond to the thick portions of the gate insulating layer 14.

Although not shown in FIGS. 1A and 1B for ease of description, the whole TFT 1 having the structure as described above is covered with a protective film. A silicon oxide film or a silicon nitride film can be used as the protective film.

According to the structure of the TFT 1 described above, even though the gate electrode layer 15 is partially over the layers of source and drain electrodes, the film thickness of a portion of the gate insulating layer 14 located between the channel section 12 of the semiconductor layer and the gate electrode layer 15 is made smaller than the film thickness of a portion of the gate insulating layer 14 located between the source and drain electrodes 11 and the gate electrode layer 15, thereby making it possible to prevent dielectric breakdown of the gate insulating layer 14 occurring at the end of the gate electrode layer 15 due to electric field concentration.

The parasitic capacitance caused by the structure in which the gate electrode layer 15 is partially over the layers of source and drain electrodes can be reduced by forming the gate insulating layer 14 to be thick in the portions located directly above areas where the source and drain electrodes 11 are under the gate electrode layer 15.

Manufacturing Processes

Manufacturing processes of a thin film semiconductor device will next be described with reference to FIGS. 2A through 2D.

Formation of Source and Drain Electrodes

Figure 2A:
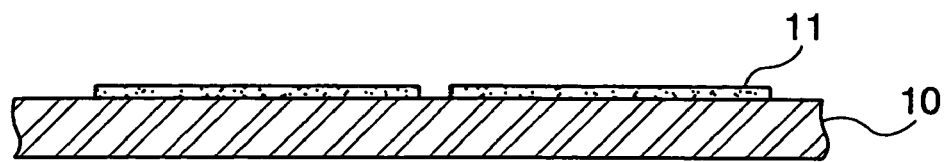
FIGS. 2A, 2B, 2C, and 2D are process diagrams for explaining manufacturing processes of a semiconductor device in the embodiment one.

Initially, the source and drain electrodes 11a and 11b are formed as shown in FIG. 2A. In specific formation of the source electrode 11a and the drain electrode 11b, films can be formed by a known sputter method or plating method and patterning can be performed by a photolithographic method. A formation material can be supplied for the formation by using a coating method including a printing method such as a screen printing method, a flexoprinting method, an offset printing method, an ink-jet method, or a microcontact printing method. Using a plating method or a printing method makes it possible to achieve low cost manufacturing without use of vacuum equipment.

Known conductive metal materials can be used for the metallic conductive layers for forming the source electrode 11a and the drain electrode 11b. For example, Cr, Al, Ta, Mo, Nd, Cu, Ag, Au, Pd, In, Ni, Nd, Co, etc., alloys using these metals, any of known metal materials, alloys thereof, metal oxides thereof, and the like may be employed. Known conductive organic materials can be used for organic conductive layers functioning as the source electrode 11a and the drain electrode 11b; PEDOT, which is a conductive polymer material, or the like can be used in this case.

Thereafter, an oxygen plasma treatment is applied to the surface of the substrate to clean the substrate.

Formation of Semiconductor Layer

Figure 2B:
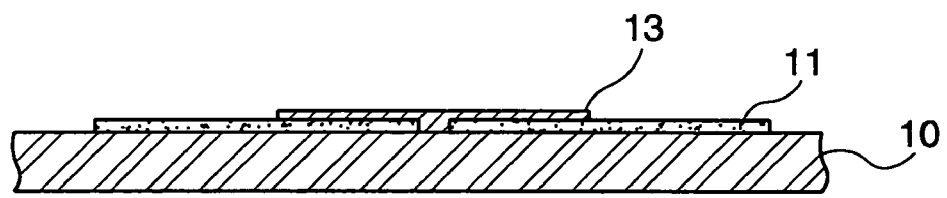

As shown in FIG. 2B, a liquid material including an organic material (hereinafter, referred to as a semiconductor material) is dropped by a droplet discharge method so as to cover at least parts of the source and drain electrodes 11a and 11b and to cover the gap between the source and drain electrodes 11a and 11b, and then an annealing treatment (drying treatment) is performed. An island shaped organic semiconductor layer having a film thickness of about 40 to 100 nm is formed to make the gap (the center region of the channel) laid thereunder and to partially cover the source and drain electrodes 11a and 11b.

The semiconductor layer 13 is formed, for example, by applying a solution containing an organic polymer material or its precursor onto the source electrode 11a, the gap, and the drain electrode 11b by a droplet discharge method to be described later, and thereafter applying a post-treatment (for example, heating, infrared radiation, ultrasonic radiation, etc.) to the coated film as the need arises.

The semiconductor layer is placed to make the gap (the center region of the channel) laid thereunder and has an island shape with a Mm thickness of about 40 to 100 nm partially covering the source and drain electrodes 11a and 11b. The shape can be adjusted by choosing quality and solid content concentration of a liquid semiconductor material, drying rate, and the like.

As the coating method at this point, it is preferable to use an ink-jet method among the liquid phase processes mentioned above. According to the ink-jet method, the organic semiconductor layer 13 can be selectively formed in the intended area without forming a resist layer or the like. The amount of an organic semiconductor material to be used and the manufacturing cost can thus be reduced.

Also, use of chemicals such as photoresists, developers, and stripping liquids as well as application of a plasma treatment such as an oxygen plasma treatment or a $CF_4$ plasma treatment can be omitted. The characteristics of the organic semiconductor material can thereby be reliably prevented from being changed (doped) or deteriorating.

Examples of the organic semiconductor material include: small molecular organic semiconductor materials such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, oligothiophene, and their derivatives; and high molecular organic semiconductor materials (conjugated polymer materials) such as poly-N-vinylcarbazole, polyvinyl pyrene, polyvinyl anthracene, polythiophene, polyhexylthiophene, poly(p-phenylenevinylene), polythienylenevinylene, polyarylamine, pyrene-formaldehyde resin, ethylcarbazole formaldehyde resin, fluorine-bithiophene copolymer, fluorene-arylamine copolymer, and their derivatives. These materials may be used singly or in combination of two or more kinds thereof, and it is preferable to use a material primarily containing a high molecular organic semiconductor material (conjugated polymer material). In a conjugated polymer material, the migratory aptitude of a carrier is very high due to its particular electron cloud spread. The film formation using such a high molecular organic semiconductor material can be performed in a simple manner. The high molecular organic semiconductor material can also be oriented in relative ease.

Among these materials, it is preferable to use an organic semiconductor material containing as its main component at least one kind of copolymers containing fluorene and bithiophene such as fluorine-bithiophene copolymer, polyarylamine, polymers containing arylamine such as fluorene-arylamine copolymer, and their derivatives, and more preferable to use an organic semiconductor material containing as its main component at least one kind of polyarylamine, fluorine-bithiophene copolymer, and their derivatives. Such an organic semiconductor material has high water resistance and high oxidation resistance. Therefore, even if the organic semiconductor layer 13 formed of such an organic semiconductor material is temporarily exposed to the conditions of high temperature and high humidity, the quality deterioration of the layer is prevented.

As the solvent, inorganic solvents such as nitric acid, sulfuric acid, ammonia, hydrogen peroxide, water, carbon disulfide, carbon tetrachloride, and ethylene carbonate can be used. Various types of organic solvents are also usable. Examples of the organic solvents include: ketone-based solvents such as methyl ethyl ketone (MEK), acetone, diethyl ketone, methyl isobutyl ketone (MIBK), methyl isopropyl ketone (MIPK), and cyclohexanone; alcohol-based solvents such as methanol, ethanol, isopropanol, ethylene glycol, diethylene glycol (DEG), and glycerin; ether-based solvents such as diethyl ether, diisopropyl ether, 1,2-dimethoxyethane (DME), 1,4-dioxane, tetrahydrofuran (THF), tetrahydropyran (THP), anisole, diethylene glycol dimethylether (diglyme), and diethylene glycol ethylether (carbitol); cellosolve-based solvents such as methyl cellosolve, ether cellosolve, and phenyl cellosolve; aliphatic hydrocarbon-based solvents such as hexane, pentane, heptane, and cyclohexane; aromatic hydrocarbon-based solvents such as toluene, xylene, and benzene; aromatic heterocyclic compound-based solvents such as pyridine, pyrazine, furan, pyrrole, thiophene, and methyl pyrrolidone; amide-based solvents such as N,N-dimethylformamide (DMF), and N,N-dimethylacetamide (DMA); halide-based solvents such as dichloromethane, chloroform, and 1,2-dichloroethane; ester-based solvents such as ethyl acetate, methyl acetate, and ethyl formate; and sulfur compound-based solvents such as dimethyl sulfoxide (DMSO), and sulfolane; nitrile-based solvents such as acetonitrile, propionitrile, and acrylonitrile; organic acid-based solvents such as formic acid, acetic acid, trichloroacetic acid, and trifluoroacetic acid. Alternatively, mixed solvents containing these solvents can be used.

In addition, the organic semiconductor material contains a conjugated system such as aromatic hydrocarbon radical or heterocyclic radical, and therefore is likely to be easily soluble in an aromatic hydrocarbon-based solvent. For this reason, toluene, xylene, trimethylbenzene, tetramethylbenzene, cyclohexylbenzene, and the like are particularly suitable solvents.

Formation of Gate Insulating Layer

Figure 2C:
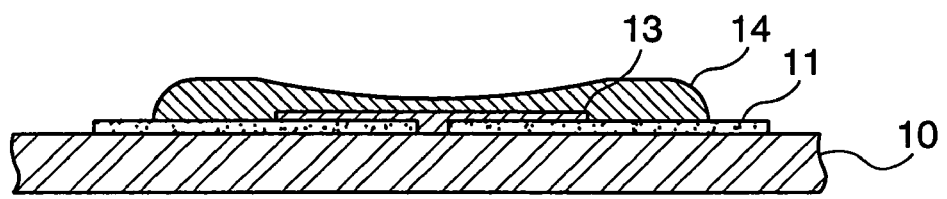

As shown in FIG. 2C, a liquid material containing a gate insulating layer material dissolved in a solvent is discharged to the substrate 10 to form a coated film on the source electrode 11a, the drain electrode 11b, and the semiconductor layer 13 (hereinafter, referred to as on the "base member"), and thereafter the solvent is removed from the coated film (namely, drying the coated film). The gate insulating layer 14 is thereby formed.

The kind of a material to be used for the gate insulating layer 14 is not particularly limited. In this case, an organic material is desirable for use; polyvinylphenol, polyimide, poly(methyl methacrylate), polystyrene, polyvinyl alcohol, polyvinyl acetate, polyolefin-based polymers represented by polyisobutylene, copolymers of these materials, and the like can be mentioned as the organic material.

For example, a solution of 1% polymethyl methacrylate butyl acetate may be dropped by a droplet discharge method to form the gate insulating layer 14 so that the film thickness of the portion located directly above the channel section is even and smaller than the film thickness of the later-described portion.

The solvent to be used is not particularly limited as long as it does not solve an organic semiconductor layer. In discharge by an inkjet method, for example, the solvent capable of adjusting a surface profile, a solid content concentration, a surface tension, and the like to be suitable for the discharge is preferable.

In the present embodiment, local deposition of a solid content in the periphery of the coated film is started in the process of drying the coated film described above. Since most of the gate insulating layer material contained in the coated film is deposited in the periphery where the deposition is star, the gate insulating layer 14 can have such a shape as shown in FIG. 2C without reduction of the external diameter of the coated film.

At this time, the solvent is removed by adjusting the drying rate at the end of the coated film to be higher than that in the portion other than the end. For example, if the same amount of liquid material is placed on the base member to form a coated film, the smaller the contact angle with respect to the base member is, the larger the external diameter of the coated film is. If the external diameter of the coated film is large, the drying rate tends to be high. Thus, the smaller the contact angle on the surface of the base member with respect to the discharged liquid material is, the higher the drying rate is.

The contact angle is made smaller, for example, by applying a lyophilic treatment to the surface of the base member, and is made larger by applying a lyophobic treatment to the surface of the base member. It is also possible to adjust the external diameter of the coated film by adding a surface tension adjuster such as an interfacial active agent or an organic solvent to a liquid material.

If the progress of drying is speeded up at the end of the coated film placed on the base member, the solvent rapidly evaporates at the end of the coated film and the solid content concentration increases during the early stage of drying. In this case, when the solid content concentration at the end of the coated film reaches the saturated concentration, the solid content is locally deposited at the end. As a result, a state in which the end of the coated film seems to be pinned by the deposited solid content is caused.

The amount of deposition in the portion other than the end of the coated film (the portion of the gate insulating layer 14 that is located directly above the gap of the semiconductor layer 13) can also be adjusted by increasing the concentration of a solute dissolved in a liquid material prior to the discharge. The film thickness of the gate insulating layer 14 located directly above the gap can be increased by increasing the concentration, and can be decreased by decreasing the concentration.

The discharge of a liquid material containing an organic material may also be repeated plural times, so that the gate insulating layer 14 having different film thicknesses between the center portion and the periphery is formed.

Formation of Gate Electrode Layer

Figure 2D:
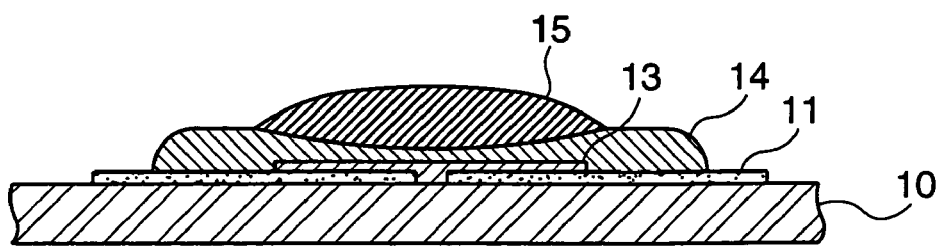

As shown in FIG. 2D, the gate electrode layer 15 is formed on the gate insulating layer 14.

The same material as used for the source electrode 11a and the drain electrode 11b may be used for the gate electrode layer 15. However, since the gate electrode layer is formed on an organic material it is preferable to form the layer by a coating method such as a printing method represented by an ink-jet method.

In this case, the gate electrode layer 15 can be formed by a coating method using a solution containing at least either of metal particulates or an organic metallic compound. As the solution, a dispersion liquid in which metal particulates are dispersed in a dispersion medium, a liquid organic metallic compound, a solution of organic metallic compound, or a mixture of these liquids can be used.

If the solution contains metal particulates, the metal particulates may have their surfaces modified with an organic matter by adsorbing an organic matter or the like to the surfaces for the purpose of improving dispersion.

As the organic metallic compound, for example, a compound or complex containing gold, silver, copper, palladium, or the like from which metal is deposited by a thermal decomposition can be used. Specific examples of the compound or complex are: chlorotriethyl phosphine gold(I), chlorotrimethyl phosphine gold(I), chlorotriphenyl phosphine gold(I), silver(I)2,4-pentanedionato complex, trimethyl phosphine (hexafluoro acetylacetonate)silver(I) complex, copper(I) hexafluoro pentanedionato cyclooctadiene complex, etc.

The dispersion medium to be used is not particularly limited as long as the metal particulates mentioned above can be dispersed with it and it does not cause aggregation. The solvent is not particularly limited as long as the organic metallic compound mentioned above can be dissolved with it. However, it is preferable to use the dispersion medium or the solvent with which the gate insulating layer 13 is neither dispersed nor dissolved.

Specific examples of the dispersion medium or the solvent as described above include: in addition to water, alcohols such as methanol, ethanol, propanol, and butanol; hydrocarbon-based compounds such as n-heptane, n-octane, decane, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methylethyl ether, diethylene glycol dimethyl ether, diethylene glycol diethyl ether, diethylene glycol methylethyl ether, 1,2-dimethoxyethane, bis(2-methoxyethyl)ether, and p-dioxane; and polar compounds such as propylene carbonate, γ-butyrolactone, N-methyl-2-pyrrolidone, dimethylformamide, dimethylsulfoxide, and cyclohexanone.

Among these compounds, water, alcohols, hydrocarbon-based compounds, and ether-based compounds are preferable in terms of dispersibility of particulates, stability of a dispersion liquid, and solubility of an organic metallic compound. Water and hydrocarbon-based compounds can be mentioned as more preferable dispersion media or solvents. These dispersion media or solvents may be used singly or in a mixture of two or more kinds thereof.

A liquid material containing at least either metal particulates or an organic metallic compound is applied by using a droplet discharge method. If the solvent is removed after the application of the liquid material and the metal particulates are used, a heat treatment may be performed for the purpose of improving electric interengagement between the metal particulates. The maximum temperature of the heat treatment is limited by the boiling point of the solvent and the temperature at which a crack occurs due to the difference in thermal expansion coefficient between each material and the metallic conductive layer. In particular, the heat treatment is preferably performed approximately at a temperature not less than room temperature (25° C.) nor more than 200° C. in order to prevent the occurrence of a crack. The heat treatment may be performed by lamp annealing other than normal treatments by a hot plate and an electric furnace.

Alternatively, the layer can be formed by using an organic conductive material, specifically a conductive polymer material. An aqueous solution of polyethylenedioxythiophene/polystyrenesulfonate (PEDOT/PSS) can be used as the conductive polymer material. The aqueous solution of PEDOT (0.5 wt %)/PSS (0.8 wt %) is applied by using the droplet discharge method described above. After the application of the liquid material, a post-treatment (for example, heating, infrared radiation, ultrasonic radiation, etc.) may be performed for the coated film as the need arises in order to form the layer. Since PSS has characteristics of acidity, a high percentage of PEDOT/PSS leads to reduction in dispersibility of a metal colloid. It is therefore preferable that PEDOT/PSS be approximately in the range of 1 to 10% with respect to metal particulates. Then an annealing treatment is applied, which is preferably performed at a temperature not less than room temperature nor more than 200° C. due to the heat resistance limitation of the conductive polymer material.

The semiconductor device described in the embodiment may be a semifinished product as long as it includes an organic TFT on the substrate and has a form in which it can be transferred in a business transaction. Examples of the semiconductor device include liquid crystal displays, organic electroluminescent (EL) devices, electrophoretic displays, and the like. These devices are formed by providing an electro-optic material on pixel electrodes of organic TFTs.

Embodiment Two

Figure 3:
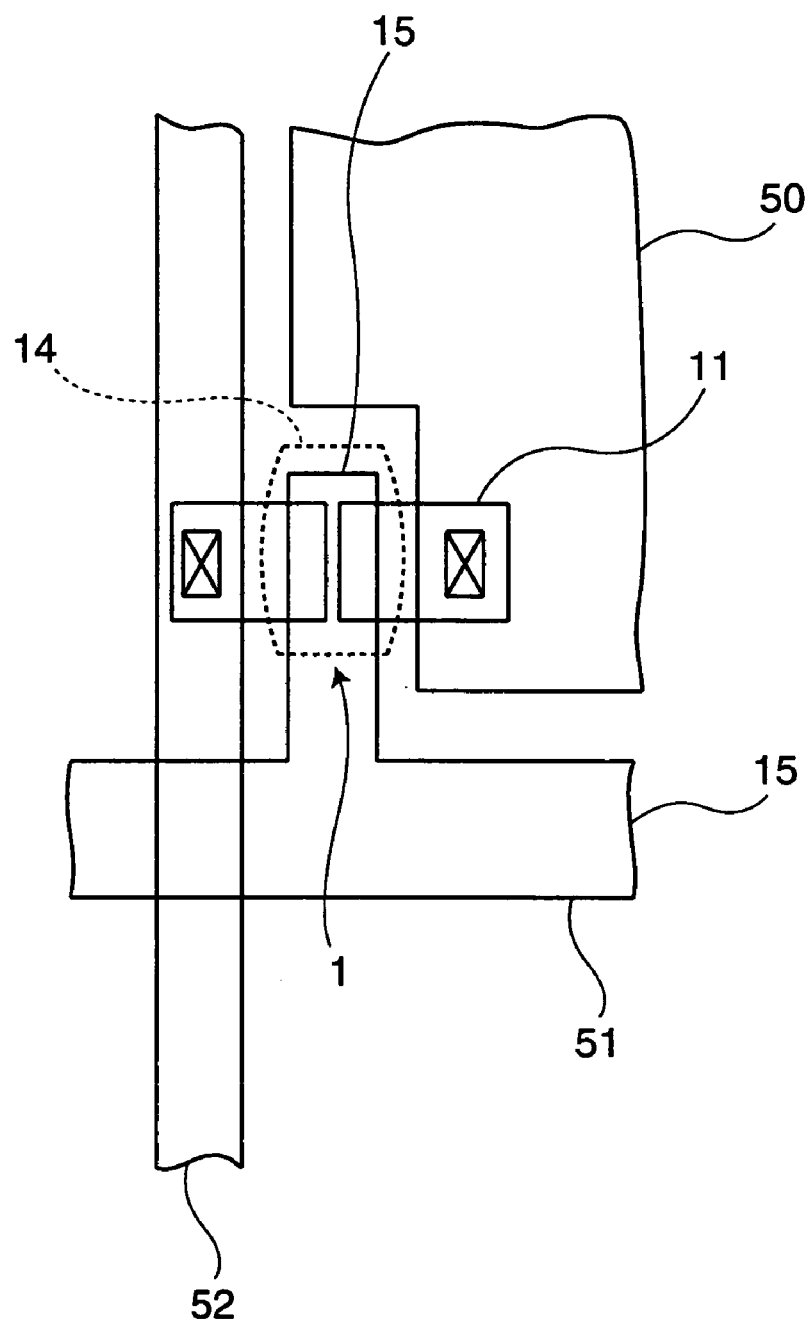
FIG. 3 is an explanatory diagram for explaining another embodiment (pixel electrode drive transistor).

FIG. 3 shows an example in which an organic TFT in a semiconductor device of the embodiment one is used for driving a pixel electrode 50 of a two-dimensional display. In FIG. 3, elements corresponding to those in FIG. 1 are indicated by the same reference numbers.

A row select line 51 connected to a row decoder (not shown) is connected to the gate electrode 15, and a data line 52 connected to a column decoder (not shown) is connected through the source and drain electrodes 11 of the TFT 1 to the pixel electrode 50. This TFT 1 is formed in the same manner as the TFT 1 shown in FIG. 1 such that the film thickness of the gate insulating layer 14 is made thin in the channel region located under the gate electrode layer 15 and gradually increases towards the end of the gate electrode layer 15.

Embodiment Three

The semiconductor device as described above can be incorporated into various electronic apparatuses. Description will be given below on electronic apparatuses that include a semiconductor device and are manufactured by an electronic apparatus manufacturing method according to an embodiment of the invention.

Electronic Paper

Figure 4:
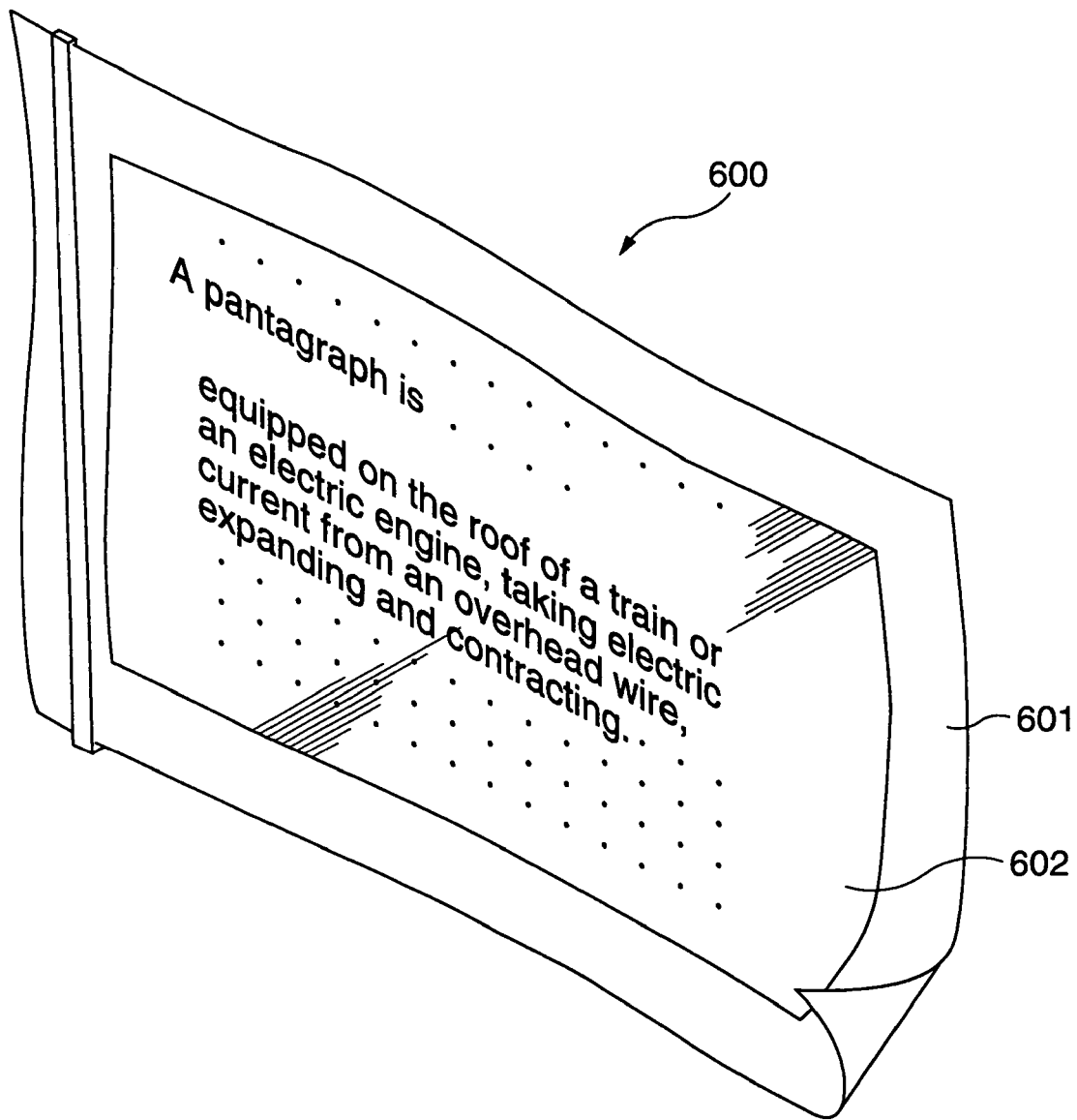
FIG. 4 is a perspective view showing an embodiment of electronic paper.

FIG. 4 is a perspective view that shows an embodiment in which an electronic apparatus according to an embodiment of the invention is applied to electronic paper. Electronic paper 600 shown in the drawing includes a main body 601 composed of a rewritable sheet having the same texture and flexibility as paper and a display unit 602. In the electronic paper 600, the display unit 602 is composed of, for example, an electrophoretic display 200 as described above.

Display

Figure 5A:
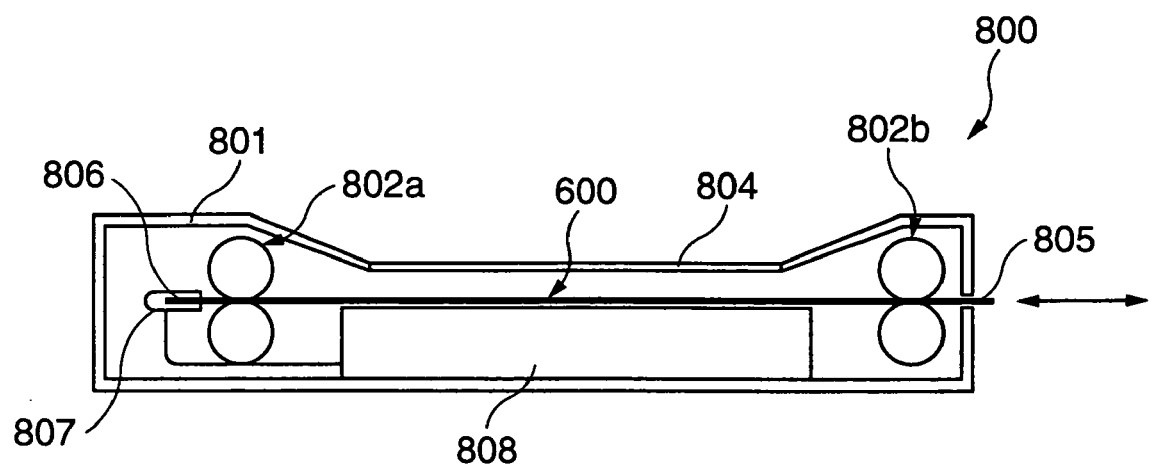
FIG. 5 is a view showing an embodiment of a display.
Figure 5B:
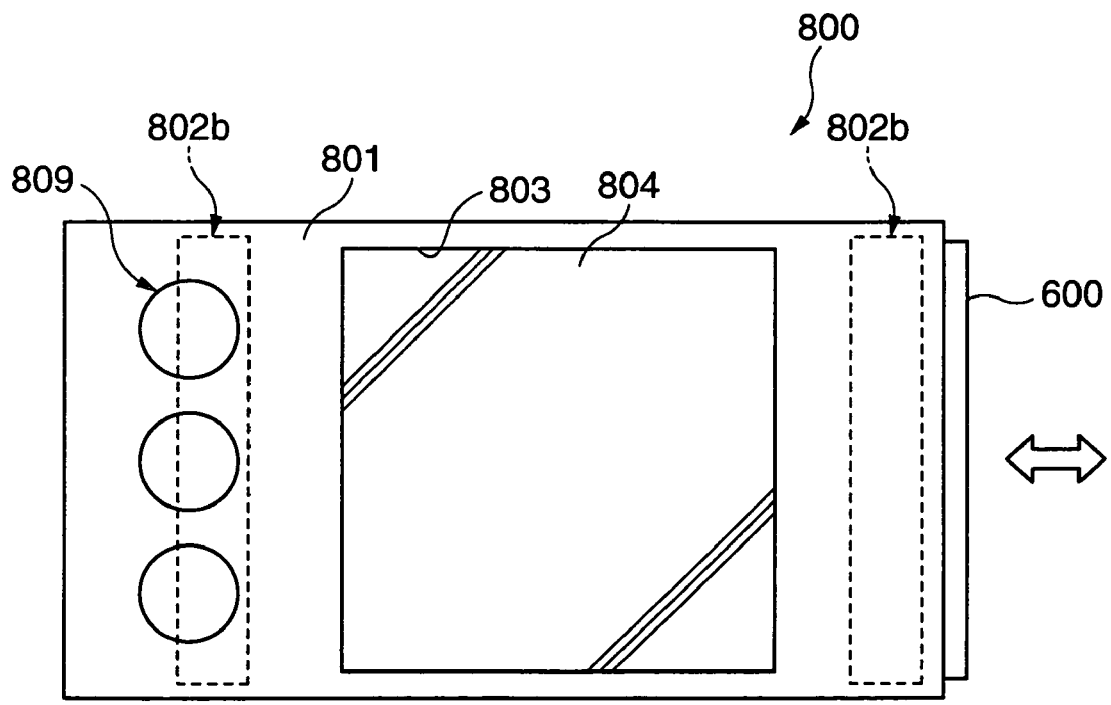

FIGS. 5A and 5B are views that show an embodiment in which the electronic apparatus according to an embodiment of the invention is applied to a display; FIG. 5A is a sectional view and FIG. 5B is a plan view. A display 800 shown in these drawings includes a main body 801 and the electronic paper 600 provided to be freely attachable to or detachable from the main body 801. The electronic paper 600 has the above structure, namely, the same structure as shown in FIG. 4.

The main body 801 has in the side portion (right side in the drawing) an insertion slot 805 into which the electronic paper 600 can be inserted, and has two pairs of carrier rollers 802a and 802b provided in the inside. When inserted through the insertion slot 805 into the inside of the main body 801, the electronic paper 600 is placed in the main body 801 to be sandwiched by the pairs of carrier rollers 802a and 802b.

A rectangular opening 803 is formed at the display surface side of the main body 801 (as shown in FIG. 5B, at the front side of the page), and a transparent glass plate 804 is fitted to the opening 803. Thus, the electronic paper 600 placed in the main body 801 is visible from the outside of the main body 801. Namely, in the display 800, the display surface is structured such that the electronic paper 600 placed in the main body 801 is recognized with eyes through the transparent glass plate 804.

A terminal section 806 is provided at the end in the insertion direction (at the left side in the drawing) of the electronic paper 600. Inside the main body 801 is provided a socket 807, to which the terminal section 806 is connected while the electronic paper 600 is placed in the main body 801. A controller 808 and an operation section 809 are electrically connected to the socket 807.

In the display 800 as described above, the electronic paper 600 is placed to be freely attachable to or detachable from the main body 801, and therefore can also be used portably in the state of being detached from the main body 801.

In the display 800 as described above, the electronic paper 600 is composed of the electrophoretic display 200 as described above.

The electronic apparatus according to an embodiment of the invention is not limited to the application to those described above. The application to various apparatuses can be made. Examples of the apparatuses include: television sets, viewfinder type or monitor-direct-view-type video tape recorders, car navigation devices, pagers, personal organizers, electronic calculators, electronic paper, word processors, personal computers, work stations, television telephones, POS terminals, and apparatuses with a touch panel. The semiconductor device described above can be applied to displays of these various electronic apparatuses.

It will be appreciated that the semiconductor device of the present invention is not limited to the above-described embodiments and various changes and modifications can be made without departing from the spirit and scope of the invention.

What is claimed is:

1. A semiconductor device, comprising:
   first and second electrodes disposed apart from each other on a substrate;
   a gate electrode disposed so as to face the first and second electrodes and to cover at least part of each of the first and second electrodes, the gate electrode being substantially ovular in shape;
   a semiconductor layer disposed between the first and second electrodes and the gate electrode; and
   a gate insulating layer disposed between the gate electrode and the semiconductor layer;
   the gate insulating layer having a film thickness that is greater in portions located directly above areas where the first and second electrodes are under the gate electrode than in a portion located directly above an area between the first and second electrodes.

2. The semiconductor device of claim 1, wherein a portion of the semiconductor layer formed between the first and second electrodes is a channel region.

3. The semiconductor device of claim 1, wherein the gate insulating layer is formed to have a film thickness that gradually increases from the portion located directly above an area between the first and second electrodes towards the portions located directly above areas where the first and second electrodes are under the gate electrode.

4. An electronic apparatus comprising the semiconductor device of claim 1.

5. The semiconductor device of claim 1, wherein the gate electrode has metal particulates, surfaces of the metal particulates being modified with an organic matter.

6. A semiconductor device, comprising:
   first and second electrodes formed on a substrate;
   a semiconductor layer formed to cover an area between the first and second electrodes on the first and second electrodes;
   a gate insulating layer formed on the semiconductor layer; and
   a gate electrode formed on the gate insulating layer, the gate electrode being substantially ovular in shape;
   the gate electrode having portions that are directly above the first and second electrodes, and
   the gate insulating layer having a film thickness that is greater in portions located directly above areas where the first and second electrodes are under the gate electrode than in a portion located directly above an area between the first and second electrodes.

7. The semiconductor device of claim 6, wherein the gate electrode has metal particulates, surfaces of the metal particulates being modified with an organic matter.

8. A method of manufacturing a semiconductor device, comprising:
   forming a first and second electrodes that are disposed apart from each other on a substrate;
   forming a semiconductor layer in an area between the first and second electrodes and on the first and second electrodes;
   forming a gate insulating layer so as to cover the semiconductor layer; and
   forming a gate electrode layer on the gate insulating layer, the gate electrode being substantially ovular in shape and covering at least part of each of the first and second electrodes;
   the gate insulating layer being formed to have a film thickness that is greater in portions located directly above areas where the first and second electrodes are under the gate electrode than in a portion located directly above an area between the first and second electrodes.

9. The method of manufacturing a semiconductor device of claim 8, wherein the step of forming a gate insulating layer includes
   providing a liquid material in which a gate insulating layer material is dissolved in a solvent on the semiconductor layer to form a coated film, and
   removing the solvent from the coated film.

10. The method of manufacturing a semiconductor device of claim 9, wherein the step of removing the solvent from the coated film adjusts a drying rate at an end of the coated film to be faster than a drying rate in a portion other than the end.

11. The method of manufacturing a semiconductor device of claim 9, wherein prior to the step of forming the gate insulating layer, a treatment to reduce a contact angle with respect to the liquid material in an area to be provided with the liquid material is performed.

12. The method of manufacturing a semiconductor device of claim 9, wherein prior to the step of forming the gate insulating layer, a surface tension adjuster is added to the liquid material to reduce a contact angle with respect to the liquid material in an area to be provided with the liquid material.

13. The method of manufacturing a semiconductor device of claim 9, wherein the liquid material is discharged from a droplet discharge device and is provided to the semiconductor layer.

14. A method of manufacturing an electronic apparatus using the method of manufacturing a semiconductor device of claim 8.

* * * * *